US006596460B2

(12) United States Patent
Timpe et al.

(10) Patent No.: US 6,596,460 B2
(45) Date of Patent: Jul. 22, 2003

(54) POLYVINYL ACETALS HAVING AZIDO GROUPS AND USE THEREOF IN RADIATION-SENSITIVE COMPOSITIONS

(75) Inventors: Hans-Joachim Timpe, Osterode (DE); Ursula Müller, Herzberg am Harz (DE)

(73) Assignee: Kodak Polychrome Graphics LLC, Norwalk, CT (US)

( * ) Notice: Subject to any disclaimer, the term of this patent is extended or adjusted under 35 U.S.C. 154(b) by 0 days.

(21) Appl. No.: 09/751,183

(22) Filed: Dec. 29, 2000

(65) Prior Publication Data

US 2002/0090566 A1 Jul. 11, 2002

(51) Int. Cl.[7] .......................... G03C 1/73; G03C 1/725; G03C 1/735; G03C 1/52; G03C 1/77; G03F 7/26

(52) U.S. Cl. ................................ 430/270.1; 430/287.1; 430/905; 430/906; 430/907; 430/909; 430/910; 430/195; 430/271.1; 430/278.1; 430/302; 430/944; 526/266; 525/61

(58) Field of Search ....................... 526/266; 430/270.1, 430/287.1, 905, 906, 907, 909, 910, 271.1, 278.1, 302, 944, 195; 525/61

(56) References Cited

U.S. PATENT DOCUMENTS 4,413,091 A * 11/1983 Iwasaki et al. ............. 430/195
4,741,985 A 5/1988 Aoai et al. .................. 430/175

(List continued on next page.)

FOREIGN PATENT DOCUMENTS

DE 838025 5/1952
DE 2751060 1/1979

(List continued on next page.)

*Primary Examiner*—Janet Baxter
*Assistant Examiner*—Sin J. Lee
(74) *Attorney, Agent, or Firm*—Faegre & Benson LLP

(57) ABSTRACT

A copolymer useful in radiation sensitive compositions for lithographic printing plates comprises the units A, B, C and D, wherein A is present in an amount of 0.5 to 30 wt.-% and is of the formula (A)

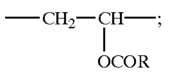

wherein R is hydrogen, $C_1$–$C_4$ alkyl, —CH=COOH or

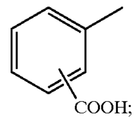

B is present in an amount of 5 to 35 wt.-% and is of the formula (B)

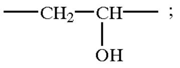

C is present in an amount of 10 to 55 wt. % and is of the formula (C)

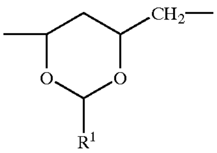

wherein $R^1$ is an alkyl group with up to 4 carbons, which is optionally substituted by an acid group, or a phenyl group to which an acid group is attached, wherein the phenyl group optionally comprises 1 to 2 further substituents selected from halogen atoms, amino, methoxy, ethoxy, methyl and ethyl groups, or is a group Z—$NR^2$—CO—Y—COOH, wherein Z is an aliphatic, aromatic or araliphatic spacer group, $R^2$ is hydrogen or an aliphatic, aromatic or an araliphatic moiety and Y is a saturated or unsaturated chain- or ring-shaped spacer group, and unit C may have one or more occurrences in the copolymer with various moieties $R^1$ independent of one another; and D is present in an amount of 10 to 40 wt.-% and is of the formula (D)

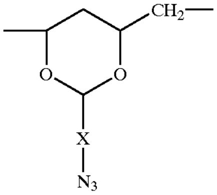

wherein X is $C_1$–$C_6$ alkylene, a 5 or 6 membered saturated carbocyclic moiety optionally substituted with one or more substituents selected from the group consisting of $C_1$-$C_4$ alkyl, $C_1$–$C_4$ alkoxy or halogen, a 5 or 6 membered saturated heterocyclic moiety which comprises in the nucleus one or more heteroatoms selected from oxygen, nitrogen and sulfur, or a group of the formula I (I)

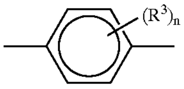

wherein n is an integer from 0 to 4 and each $R^3$ is independently selected from the group consisting of $C_1$–$C_4$ alkyl, halogen or $C_1$-$C_4$ alkoxy.

10 Claims, No Drawings

U.S. PATENT DOCUMENTS

| | | | | |
|---|---|---|---|---|
| 4,912,083 | A | 3/1990 | Chapman et al. | 503/227 |
| 4,940,646 | A | 7/1990 | Pawlowski | 430/175 |
| 4,942,141 | A | 7/1990 | DeBoer et al. | 503/227 |
| 4,948,776 | A | 8/1990 | Evans et al. | 503/227 |
| 4,948,777 | A | 8/1990 | Evans et al. | 503/227 |
| 4,948,778 | A | 8/1990 | DeBoer | 503/227 |
| 4,950,639 | A | 8/1990 | DeBoer et al. | 503/227 |
| 4,950,640 | A | 8/1990 | Evans et al. | 503/227 |
| 4,952,552 | A | 8/1990 | Chapman et al. | 503/227 |
| 4,973,572 | A | 11/1990 | DeBoer | 503/227 |
| 5,036,040 | A | 7/1991 | Chapman et al. | 503/227 |
| 5,166,024 | A | 11/1992 | Bugner et al. | 430/70 |
| 5,254,431 | A | 10/1993 | Etherington et al. | 430/171 |
| 5,278,023 | A | 1/1994 | Bills et al. | 430/201 |
| 5,491,046 | A | 2/1996 | DeBoer et al. | 430/302 |
| 5,658,708 | A | 8/1997 | Kondo | 430/288.1 |
| 5,705,309 | A | 1/1998 | West et al. | 430/167 |
| 5,741,619 | A | 4/1998 | Aoshima et al. | 430/175 |
| 6,037,085 | A | 3/2000 | Holman, III et al. | 430/18 |

FOREIGN PATENT DOCUMENTS

| | | |
|---|---|---|
| EP | 0152819 | 1/1985 |
| EP | 0216083 | 7/1986 |
| EP | 0562952 | 3/1993 |
| EP | 0672544 | 3/1995 |
| EP | 0672954 | 3/1995 |
| EP | 0819980 | 7/1996 |
| EP | 0819985 | 6/1997 |
| EP | 0823327 | 8/1997 |
| JP | 10161304 | 6/1998 |
| WO | 9739894 | 10/1997 |
| WO | 9831545 | 7/1998 |
| WO | 9911456 | 3/1999 |
| WO | 0048836 | 8/2000 |

* cited by examiner

POLYVINYL ACETALS HAVING AZIDO GROUPS AND USE THEREOF IN RADIATION-SENSITIVE COMPOSITIONS

BACKGROUND OF THE INVENTION

1. Field of the Invention

The present invention relates to binders and radiation-sensitive compositions comprising such binders. More particularly, this invention relates to polyvinyl acetal copolymer compounds having azido groups, and the use of such compounds as binders in radiation sensitive compositions which are suitable for the production of lithographic printing plates.

2. Background Information

It is well know that radiation-sensitive compositions useable particularly for high-performance lithographic plates must fulfill high requirements.

To improve the properties of radiation-sensitive compositions and corresponding lithographic plates, essentially two different techniques are available. The first technique deals with the improvement of the properties of the radiation-sensitive components in the compositions (frequently negative diazo resins, photo polymers etc.). The second technique is the search for novel polymeric compounds (i.e. binders), which are used to control the physical properties of the radiation-sensitive layers. In particular the second technique is decisive for lithographic plates because the behavior in the developing and printing processes (such as developability, ink receptivity, scratch resistance, and consistency in the number of prints produced) is decisively influenced by the polymeric binders. Also shelf life and radiation-sensitivity of the materials are strongly influenced by such polymeric compounds.

The polymeric binders, therefore, exhibit various structural elements for satisfying the extensive requirements, which may have different effects on individual properties. For instance, hydrophilic structural elements such as carboxyl groups, hydroxyl groups and the like generally promote the developability of the radiation-sensitive compositions in aqueous alkaline developers and partly ensure sufficient adhesion to polar substrates. Hydrophobic structural elements, on the other hand, reduce the capability of being developed in the above-mentioned developers, but ensure good ink receptivity used in the printing process, which is indispensable in lithographic plates.

The latest developments in the field of printing plates deal with radiation-sensitive compositions which can be imaged by lasers. In this type of imaging, the use of films as an intermediate information carrier may be omitted since lasers can be controlled by computers.

High-performance lasers or laser diodes which are used in commercially available image-setters emit light in the wavelength ranges of between 800 to 850 nm and between 1060 and 1120 nm, respectively. Therefore,, printing plate precursors, or initiator systems contained therein, which are to be imagewise exposed using such image-setters have to be sensitive in the near IR range. Such printing plate precursors can then basically be handled under daylight conditions which significantly facilitates their production and processing. There are two different possibilities of producing radiation-sensitive compositions for such printing plates: (1) For negative printing plates, radiation-sensitive compositions are used wherein after an imagewise exposure the exposed areas are cured. In the developing step only the non-exposed areas are removed from the substrate. (2) For positive printing plates, radiation-sensitive compositions are used wherein exposed areas dissolve faster in a given developing agent than the non-exposed areas. This process is referred to as photosolubilization.

However, with respect to the radiation-sensitive compositions in positive systems, there is a certain dilemma since for a high number of copies crosslinked polymers are needed. However, such polymers are insoluble in the solvents or solvent mixtures suitable for the plate coating, thereby requiring noncrosslinked or only slightly crosslinked starting products. The necessary crosslinking can then be achieved by preheating steps which can be carried out at various stages of the plate processing.

A positive system is described in EP-A-0 819 980 where it is assumed that the non-image areas are formed by a reaction of the formed acid with carbon black. The image areas are only formed during a preheating step; for a high number of copies the image areas have to be baked.

Another positive system is described in U.S. Pat. No. 5,658,708. The necessary crosslinking of the layer is already carried out during the drying step of the coating. However, for that purpose the system has to be treated at 120° C. for 10 minutes whereby chemical processes take place which eventually lead to crosslinking. However, the required relatively long heating periods at such high temperatures represent an unacceptable waste of time in today's typical fully automated plate production lines. Baking does not lead to an increase in the number of copies since the crosslinking is partly undone.

EP-A-0 823 327, WO 99/11456 and WO 97/39894 also describe positive compositions. As is the case with many positive systems, they entail the disadvantage that a complicated conditioning step is necessary to ensure a sufficient shelf-life of the plates. Furthermore, a baking step is required to obtain high numbers of copies and a good solvent resistance. Moreover, these printing plates require the use of highly alkaline developers which are prone to reactions with atmospheric carbon dioxide, thereby necessitating the use of sealed, specialized processing equipment.

Plates which can be imagewise exposed with IR lasers are furthermore known from EP-A-0 672 544, EP-A-0 672 954 as well as U.S. Pat. No. 5,491,046, WO 00/48836 and EP-A-0 819 985. These plates are negativeworking, and after imagewise exposure they require a preheating step within a very narrow temperature range which only causes a partial crosslinking of the image layer. To meet the highest requirements regarding the number of copies and to show sufficient resistance to press room chemicals an additional heating step—what is referred to as preheating—is carried out during which these layers are further crosslinked.

U.S. Pat. No. 5,741,619 is an example of a negative working printing plate containing an IR sensitive composition of an acrylic resin, a diazonium compound and carbon black. However, such formulations require high energy IR exposure to yield an image. High energies are also needed for those compositions described in WO 98/31545.

The use of azide compounds both low-molecular weight or polymer bonded, in printing plates designed for imaging with either ultraviolet light (U.S. Pat. No. 4,940,646 and U.S. Pat. No. 5,254,431) or infrared light exposure is well known. For later applications it is believed that heating of the azides results in the elimination of nitrogen gas and the formation of reactive nitrene intermediates. They can be used to crosslink polymers containing C═C bonds (U.S. Pat. No. 5,705,309, JP 10161304) to improve the network formation. These formulations consist of a mixture of low-molecular multifunctional azides and a polymeric binder or combinations of polymers. Therefore, problems with layering during coating of these formulations onto substrates and consecutive drying can occur.

In a different context, the nitrogen gas evolution during heating of polymers with pendant azide groups assists in the ablative transfer or removal of materials during imaging (U.S. Pat. No. 5,278,023, U.S. Pat. No. 6,037,085, EP-B 562,952). However, such compositions require special caution for the exposure units to avoid deposition of ablated materials.

There is a continuing need for lithographic printing plates that can be imaged in the near infrared region using moderate light power, and that can be processed under simple processing conditions.

SUMMARY OF THE INVENTION

It is an object of the present invention to provide polymers for radiation-sensitive compositions which ensure a good adhesion to normal aluminum substrates and thus lead to an acceptable number of prints produced without affecting ink receptivity. It is another object of the present invention to provide polymers enabling compositions to suffice with as few components as possible vis-a-vis the compositions described in the state of the art when used in radiation-sensitive compositions (which makes them economically desirable), prevent layering problems during coating while maintaining the same physical properties.

These objects are achieved by means of the azido acetal copolymer compounds described herein. When used in radiation-sensitive compositions, these compounds must be used in combination with a light-heat-transformer.

In particular, the present invention relates to a radiation-sensitive composition comprising:

(a) polymeric binder compound; and (b) a light-heat-transformer;

The radiation-sensitive composition may optionally additionally contain at least one other component selected from: (i) dyes, pigments or combinations thereof for increasing the color of the image, (ii) surfactants, and (iii) plasticizers.

The polymeric binder is a copolymer which comprises units A, B, C, D, wherein:

A is present in an amount of 0.5 to 30 wt.-% and is of the formula

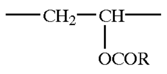

(A)

wherein R is hydrogen, —$C_1$–$C_6$ alkyl,—CH=CH—COOH or

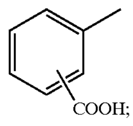

B is present in an amount of 5 to 35 wt.-% and is of the formula

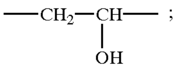

(B)

C is present in an amount of 10 to 55 wt.-% and is of the formula

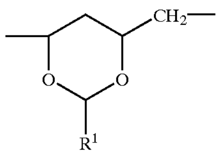

(C)

wherein $R^1$ is an alkyl group with up to 4 carbons, which is optionally substituted by an acid group, or a phenyl group to which an acid group is attached, wherein the phenyl group optionally comprises 1 or 2 further substituents selected from halogen atoms, amino, methoxy, ethoxy, methyl and ethyl groups, or is a group Z—$NR^2$—CO—Y—COOH, wherein Z is an aliphatic, aromatic or araliphatic spacer group, $R^2$ is hydrogen or an aliphatic, aromatic or araliphatic moiety and Y is a saturated or unsaturated chain- or ring-shaped spacer group, and unit C may have one or more occurrences in the copolymer with various moieties $R^1$ independent of one another; and D is present in an amount of 10 to 40 wt.-% and is of the formula

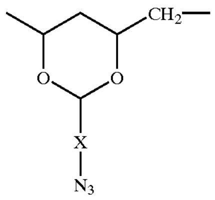

(D)

wherein X is $C_1$–$C_6$ alkylene, a 5 or 6 membered saturated carbocyclic moiety optionally substituted with one or more substituents selected from the group consisting of $C_1$–$C_4$ alkyl, $C_1$–$C_4$ alkoxy or halogen, a 5 or 6 membered saturated heterocyclic moiety which comprises in the nucleus one or more heteroatoms selected from oxygen, nitrogen and sulfur, or a group of the formula I

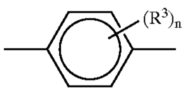

(I)

wherein n is an integer from 0 to 4 and each $R^3$ is independently selected from the group consisting of $C_1$–$C_4$ alkyl, halogen or $C_1$–$C_4$ alkoxy.

Units (A), (C) and (D) may have one or more occurrences in the binder compound molecule with independently selected different groups R, $R^1$ and X.

DETAILED DESCRIPTION OF THE INVENTION

The vinyl alcohol/vinyl acetate copolymers that serve as starting material for the preparation of the polyvinyl acetal copolymer compounds of the present invention are 70 to 98 mole % hydrolyzed and have a weight-average molecular weight $M_w$ of 20,000 to 130,000 g/mole. Suitable copolymers of this type are commercially available. The choice of which copolymer is used as a starting material for the synthesis depends on the intended use of the radiation-sensitive composition. If offset lithographic plates are to be produced, copolymers with a weight-average molecular weight $M_w$ of 35,000 to 130,000 g/mole and an hydrolysis degree of the vinyl acetate structural unit of 80 to 98 mole % are preferably used.

In unit A, the group R is preferably $C_1$–$C_6$ alkyl, more preferably ethyl or methyl, or —CH═CHCOOH.

In unit C, $R^1$ is preferably $C_1$–$C_6$ alkyl or a phenyl group to which an acid group is attached, and more preferably $R^1$ is methyl, ethyl or propyl.

The acetal unit D is obtained by the reaction of vinyl alcohol units with an aldehyde of formula II (II)

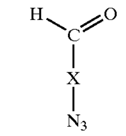

wherein X is $C_1$–$C_6$ alkylene, a 5 or 6 membered saturated carbocyclic moiety optionally substituted with one or more substituents selected from the group consisting of $C_1$–$C_4$ alkyl, $C_1$–$C_4$ alkoxy or halogen, a 5 or 6 membered saturated heterocyclic moiety which comprises in the nucleus one or more heteroatoms selected from oxygen, nitrogen and sulfur, or a group of the formula I (I)

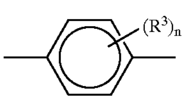

wherein n is an integer from 0 to 4 and each $R^3$ is independently selected from the group consisting of $C_1$–$C_4$ alkyl, halogen or $C_1$–$C_4$ alkoxy; preferably X is represented by formula (I). Most preferably X is represented by formula (I) with n=0.

In formula I, n is preferably an integer from 0 to 4, more preferably n is 0 or 1; each $R^3$ is preferably independently selected from the group consisting of $C_1$–$C_4$ alkyl, $C_1$–$C_4$ alkoxy or halogen; more preferably $R^3$ is $C_1$–$C_4$ alkyl, and most preferably methyl.

When used within this description and the appended claims the terms "alkyl" and "alkylene" include straight-chain groups and branched groups; unless defined otherwise these groups have 1 to 6 carbon atoms, preferably 1 to 4 carbon atoms.

Unit A is present in the copolymer compound of the present invention in an amount of about 0.5 to about 30 wt-% based on the total copolymer compound, preferably about 5 to about 20 wt-%, most preferably about 10 to about 15 wt-%.

The amount of unit B in the copolymer compound of the present invention is about 5 to about 35 wt-% based on the total copolymer compound, preferably about 10 to about 20 wt-% and most preferably about 10 to about 15 wt-%.

The amount of unit C in the copolymer compound of the present invention is about 10 to about 55 wt-% based on the total copolymer compound, preferably about 25 to about 45 wt-% and most preferably about 30 to about 40 wt-%.

The azido acetal unit D is present in an amount of about 10 to about 40 wt-% based on the total copolymer compound, preferably about 15 to about 30 wt-% and most preferably about 20 to about 25 wt-%.

Although the copolymer compounds of the present invention may comprise a small amount of units different from units A to D (for example less than 10 wt-% based on the total compound) it is preferred that the compounds consist of units A to D.

The copolymer compound of the present invention preferably has a weight-average molecular weight of about 40,000 to about 230,000 g/mole.

The preparation of the azido-group containing polyvinyl acetal copolymer compounds of the present invention comprises reacting vinyl alcohol/vinyl acetate copolymers, azido aldehydes and other aldehydes.

The reaction may be carried out according to known standard methods for the synthesis of polyvinyl acetal in the presence of catalytic amounts of a mineral acid; examples are described in EP-B-216 083 and DE-C-2 838 025.

The reaction may either take place in an organic solvent for the vinyl alcohol/vinyl acetate copolymers (described, for example, in the brochure for Mowiol R-Polyvinyl alcohol, *Hoechst AG,* 1991, page C13) (a particularly preferred solvent is dimethyl sulfoxide), or in water in the presence of a surfactant or in a mixture of water and a hydroxyl-group containing solvent, such as ethanol, n-propanol or iso-propanol, with a n-propanol/water mixture being particularly preferred. The reaction is usually carried out at temperatures from 50 to 70° C. and with reaction times of 5 to 10 hours. The concentration of the reaction components based on the amount of solvent is 10 to 18 wt.-%, particularly preferred are 14 wt.-%. The catalytic amount of added mineral acid is between 0.75 and 1.5 wt.-%. This amount of mineral acid must be neutralized upon completion of the reaction by adding molar amounts of an alkaline salt, such as sodium and potassium carbonate to prevent an acidically catalyzed deacetalization of the polymeric binders during storage or later use. Sodium and potassium hydroxide are also suitable for the neutralization. The total amount of used azido aldehyde and additional aldehyde is chosen such that the acetalization degree of the vinyl alcohol/vinyl acetate copolymers is between 40 and 75 wt.-%.

When preparing the copolymer compounds of the present invention in organic solvents or hydroxyl-group containing solvent/water mixtures, the end products are precipitated by stirring them into water. The precipitation procedure may also take place such that water is stirred into the reaction mixture. In both cases, the mixture must be intensely mixed to obtain a reaction product that forms as quantitatively as possible, is easy to handle and the side products can be easily separated. In reactions in water, the product will precipitate in the course of the reaction. In both cases, the precipitated reaction product is separated, washed with water and then dried using hot air at 45 to 50° C. until the water content is reduced to no more than 3 wt.-%.

To improve the developability of the imageable element in commercially available developers, a reaction with anhydrides of multifunctional acids can be followed after the drying step. Such reactions are well known in the art (e.g. U.S. Pat. No. 4,741,985, DE-A 2,751,060, EP-B 152,819). Maleic acid anhydride and phthalic acid anhydride are the most preferable compounds used in the process. The esterification by this process should proceed to such degree that the acid number of the polyvinyl acetal is between 25 to 50 mg KOH/g.

The second essential component of the radiation-sensitive composition of the present invention is a compound capable of absorbing light of a wavelength in the range of about 350 to about 1120 nm and converting the absorbed light to heat. In one embodiment of the present invention the compound is capable of absorbing light of a wavelength in the range of about 750 to about 1120 nm and converting it to heat.

The light-heat transformer compound serves to sensitize the imageable element to various wavelengths of radiation. The light-heat transformer compound operates to convert incident electromagnetic radiation into thermal energy. For this reason, it is generally desirable that the transformer exhibits only low quantum yields of fluorescence or phosphorescence light (preferably this value is zero), and does not undergo any chemical deactivation of its excited state. Additionally, the light-heat-transformer compound is highly absorptive for the incident radiation so that a relatively small amount of transformer can be used in the imageable element of this invention.

Although, in principle, light-heat-transformer compounds acting in the UV or visible region of the electromagnetic radiation can also be used, light-heat-transformer compounds sensitive in the near infrared region are preferred in this invention. Such compounds typically have a maximum absorption wavelength ($\lambda$max) in the region of at least about 750 nm; i.e. in the infrared region and near infrared of the spectrum, and more particularly, from about 800 to about 1100 nm. The compounds can be dyes or pigments, and a wide range of compounds are well known in the art, and are for instance described in U.S. Pat. No. 4,912,083, U.S. Pat. No. 4,942,141, U.S. Pat. No. 4,948,776, U.S. Pat. No. 4,948,777, U.S. Pat. No. 4,948,778, U.S. Pat. No. 4,950,639, U.S. 4,950,640, U.S. 4,952,552, U.S. 4,973,572, U.S. 5,036,040 and U.S. Pat. No. 5,166,024. Classes of materials that are useful include, but are not limited to, squarylium, croconate, cyanine (including phthalocyanine), merocyanine, chalcogenopyryloarylidene, oxyindolizine, quinoid, indolizine, pyrylium and metal dithiolene dyes or pigments. Other useful classes include thiazine, azulenium and xanthene dyes. Carbon black and other known inorganic pigments can also be used. Particularly useful infrared absorbing dyes are of the cyanine class, with cyanine dyes containing benzindolium and indolium moieties being particularly preferred.

The weight portion of the light-heat-transformer compounds present is preferably 2 to 15 wt.-% based on the radiation-sensitive composition.

Without wishing to be bound by any particular theory, and recognizing that the exact mechanism of the decomposition of the azido polyvinyl acetals is not known with certainty, it is presently believed that heat energy, produced after the excitation of a light-heat-transformer compound molecule, is transmitted to the azide group of a polyvinyl acetal polymer molecule. As a consequence, a nitrogen molecule may be evolved forming a reactive, polymer-bonded nitrene intermediate. This intermediate then reacts with C—H and/or OH bonds of a polymer molecule leading, finally, to network formation.

Polyvinylacetal compounds of the present invention make it possible to produce offset lithographic plates which require neither a cover layer nor a pre-heat step. The lithographic plates are characterized by good thermal stability, good developability and good resolution as well as good ink receptivity. Furthermore, the radiation-sensitive compositions of this invention have the advantage that they are composed of very few components and are thus more economical.

Optionally, but preferably, the radiation sensitive compositions for lithographic printing plates based on this invention contain dyes, pigments or combinations thereof for coloring of the coating.

Suitable dyes or pigments for improving the color of the image are those that dissolve well in the solvent or solvent mixture used for coating or are easily introduced as a pigment in the disperse form. Suitable colorant dyes or pigments include, inter alia, rhodamin dyes, methyl violet, anthraquinone pigments and phthalocyanine dyes or pigments. The dyes or pigments may be comprised in the radiation-sensitive composition in an amount of 0 to 15 wt.-%, preferably 2 to 7 wt.-%.

Optional, non-essential components of the radiation sensitive composition include plasticisers, stabilizers, exposure indicators and surfactants in conventional amounts. Suitable plasticizers include dibutyl phthalate, triaryl phosphate and dioctylphthalate, with dioctylphthalate being preferred. In preferred embodiments, a surfactant (such as silicone materials) may be present, but in most preferred embodiments, none of these materials are present.

The radiation-sensitive compositions of the present invention are preferably usable for producing lithographic plates. In addition, however, they may be used in recording materials for creating images on suitable carriers and receiving sheets, for creating reliefs that may serve as printing molds, screens and the like, as light-hardening varnishes for surface protection, as etch resists and for the formulation of UV-hardening printing inks.

The carrier to be used for the preparation of printing plate precursors is preferably a material in the form of a sheet or a film, having a good dimensional stability. As such a dimensionally stable sheet or film material, use is preferably made of a material that has already been used as a support in printing plate precursors; examples thereof include paper, paper coated with plastic materials (such as polyethylene, polypropylene, polystyrene), metal sheets or foils, such as aluminum (including aluminum alloys), zinc and copper sheets, plastic films made from cellulose diacetate, cellulose triacetate, cellulose propionate, cellulose acetate, cellulose acetate butyrate, cellulose nitrate, polyethyleneterephthalate, polyethylene, polystyrene, polypropylene, polycarbonate and polyvinylacetate, and a laminate comprising paper or a plastic film and one of the above-mentioned metals or a paper or plastic film which has been metallized by chemical vapor deposition. Among these carriers, an aluminum sheet or foil is especially preferred since it has good dimensional stability, is inexpensive and furthermore has excellent adhesion to the radiation-sensitive layer. Furthermore, a composite film can be used wherein an aluminum foil has been laminated onto a polyethyleneterephthalate film.

A metal carrier, in particular an aluminum carrier, is preferably subjected to a surface treatment, for example graining by brushing in a dry state, brushing with abrasive suspensions or electrochemically, e.g. in a hydrochloric acid electrolyte. The grained plates, which may be optionally anodically oxidized in sulfuric or phosphoric acid, may then be additionally subjected to a hydrophilizing aftertreatment, for instance in aqueous solutions of polyvinyl phosphonic acid, sodium silicate, calcium zirconium fluoride, or phosphoric acid. The details of the above-mentioned substrate pretreatment are well-known to the person skilled in the art.

The subsequently dried plates are coated with the radiation-sensitive compositions of organic solvents, solvent mixtures or both such that dry layer weights of preferably from about 0.5 to about 4 $g/m^2$, more preferably from about 0.8 to about 3 $g/m^2$ are obtained, most preferably from about 0.8 to about 2.2 $g/m^2$; with weights from about 1 to about 1.5 $g/m^2$ being particularly preferred.

In a few cases, the additional application of an oxygen-impermeable top layer to the radiation-sensitive layer may be advantageous. The polymers suitable for the top layer include polyvinyl alcohol, polyvinyl alcohol/polyvinyl acetate copolymers, polyvinyl pyrrolidone, polyvinyl pyrrolidone/polyvinyl acetate copolymers and gelatin. The layer weight of the oxygen-impermeable top layer is preferably 0.1 to 4 $g/m^2$, and more preferably 0.3 to 2 $g/m^2$. However, the lithographic plates produced using the radiation-sensitive compositions of the present invention do have excellent properties even without such a top layer.

Optional, but not preferred subbing or antihalation layers may be disposed under the imaging layer, or on the backside of the support (for instance when the support is a transparent polymeric film).

The radiation-sensitive composition is solvent coated by using one or more suitable organic solvents that have no effect on the sensitivity of the composition. Various solvents used for coating are well known in the art, but methylglycol, 1-methoxy-2-propanol, acetone, methyl ethyl ketone and methanol are preferred. The essential components of the composition are dissolved in the solvents in suitable proportions.

Suitable conditions for drying the radiation-sensitive composition coated onto the substrate involve heating for a period of time of from about 0.5 to about 4 minutes at a temperature in the range of from about 40° to about 120° C.

This invention is uniquely adapted for "direct-to-plate" (DTP), i.e. "computer-to plate" (CTP), imaging applications. Such systems utilize digitized image information, as stored on a computer disk, compact disk, computer tape or other digital information storage media, or information that can be provided directly from a scanner, that is intended to print. The bits of information in a digitized record correspond to the image elements or pixels of the image to be printed. This pixel record is used to control the exposure device, that is a modulated laser beam.

The laser imaging can be carried out using any moderate or high-intensity laser diode writing device. Preferably, a laser printing apparatus is provided that includes a mechanism for scanning the write beam across the element to generate an image without ablation. Preferably, infrared laser or laser diodes are used in this invention. Such devices are commercially available.

Following laser imaging, the plate is then developed in a suitable developer solution as known to persons skilled in the art. During this process the non-imaged areas are removed to provide the desired negative image. Development can be carried out under conventional conditions for about 20 to about 80 seconds and at temperatures of about 21° to about 28° C. The developed plates are usually treated with a preservative ("rubbing coating"). The preservatives are aqueous solutions of hydrophilic polymers, wetting agents and other additives.

The following examples are intended to provide a more detailed explanation of the invention without limiting it in any way.

REFERENCE EXAMPLE

Preparation of 4-azido benzaldehyde 50 g 4-fluoro benzaldehyde and 50 g sodium azide were dispersed in 150 ml dry dimethyl sulfoxide. Subsequently, the mixture was heated for 3 hours at 105° C. while nitrogen was introduced. The mixture was poured into 200 ml water, and the solution extracted with 200 ml dichloro methane (three times). Then the solvent was distilled off by means of a vacuum rotation vaporizer. 53 g of a liquid remained having infrared (IR) and nuclear magnetic resonance (NMR) spectra consistent with the 4-azido benzaldehyde structure.

EXAMPLE 1

Preparation of Copolymer 1

20 g Mowiol 8/88® ( (a vinyl alcohol/vinyl acetate copolymer available from Clariant having a portion of vinyl alcohol units of 79 wt.-% and a $M_w$ of 67,000) were dissolved in 60 ml water and 120 ml n-propanol at 90° C. in a three-neck flask equipped with magnetic stirrer, reflux condenser and thermometer on a water bath. The solution was cooled to 50° C. and 2.5 ml concentrated hydrochloric acid were added. Subsequently, a mixture of 2.0 g of 4-azido benzaldehyde and 3.6 g of n-butyraldehyde was added drop-wise and the mixture was stirred for 3 hours at 50° C. Then the solution was neutralized with 2.5 g of triethylamine. The polymer compound was isolated by precipitation in 500 ml of water, filtered and dried in a vacuum oven at 40° C. for 24 hours. The analytical examination of the product showed typical IR peaks at 2080 and 2110 $cm^{-1}$ for the azido group and 34.8 wt.-% vinyl alcohol units. The polymer was decomposed at approx. 200° C. based on thermal analysis data.

EXAMPLE 2

Preparation of Copolymer 2

11.5 g Mowital B 30 T® (polyvinyl butyral available from Clariant having portions of 26 wt.-% polyvinyl alcohol, 70 wt.-% butyracetal, and 3 wt.-% vinyl acetate units) were dissolved in 40 ml water and 80 ml n-propanol at 90° C. in equipment described in Example 1. Upon cooling down to 50° C., 0.7 ml hydrochloric acid and, subsequently, 1.2 g of 4-azido benzaldehyde in 10 ml n-propanol were added dropwise under stirring. After a reaction time of 4 hours the solution was neutralised with 0.7 g triethylamine. The polymeric binder compound was precipitated in an excess of water and dried for 24 hours at 40° C. in a rotary drying chamber. The IR examination showed two peaks at 2080 and 2110 $cm^{-1}$ for the azido group. The polymer was decomposed at approx. 200° C. based on thermal analysis data.

EXAMPLE 3

Preparation of Copolymer 3

Method 1

In a three-neck flask, equipped with thermometer, reflux condenser and magnetic stirrer, 20 g of Mowiol 5/88® (a vinyl alcohol/vinyl acetate copolymer having a portion of 79 wt.-% of vinyl alcohol units and an $M_w$: 27,000 g/mole) were dissolved in 100 ml dimethylsulfoxide (DMSO) and this solution was stirred for 14 hours at a temperature of approx. 60° C. Then, 3 g of concentrated hydrochloric acid were added, a solution of 2.1 g of propion aldehyde and 4.3 of 4-azido benzaldehyde in 20 ml DMSO were added drop-wise within 30 minutes and the mixture was stirred for another 8 hours at 50° C. The polymeric binder compound was precipitated by stirring into 800 ml of water, with 3.2 g soda dissolved therein, separated by means of vacuuming off and washed well using water. The product was dried as described above (yield: 82% based on the Mowiol 5/88® used, content of vinyl alcohol units: 39.3 wt.-%, characteristic IR bands at 2080 and 2110 $cm^{-1}$).

Method 2

This copolymer was also obtained by the following procedure: in the first reaction step, only the propion aldehyde was grafted, the polymer was isolated by precipitation in water, and after drying then dissolved again in DMSO for the reaction with azido benzaldehyde. According to the content of vinyl alcohol units and characteristic IR bands the obtained polymer was identical with that obtained via Method 1.

EXAMPLE 4

Preparation of Copolymer 4

1.75 g maleic anhydride were dissolved in 10 ml DMSO. 1.92 g 2-(N-methylamino)-acetaldehyde dimethyl acetal were added dropwise to this solution while cooled such that the temperature did not rise higher than 20° C. Subsequently, the mixture was heated to 60° C. for 30 minutes. Then 20 g Mowiol 8/88® (a vinyl alcohol/vinyl acetate copolymer available from Clariant having a portion of vinyl alcohol units of 79 wt.-% and an $M_w$: 67,000 g/mole) were dissolved at 70° C. in 120 ml DMSO and this solution was added to the above mixture. The resulting mixture of the two solutions was then stirred for 16 hours at 70° C. Subsequently, a mixture of 3.5 g propion aldehyde and 2.6 g 4-azido benzaldehyde dissolved in 10 ml DMSO was added dropwise under stirring and kept at 50° C. for another 5 hours. The polymeric binder compound was precipitated in 500 ml of water and dried for 24 hours at 40° C. in a rotary drying chamber (yield: 87% based on Mowiol 8/88® used). The analytical examination of the product revealed an acid number of 31 mg KOH per gram polymer and IR peaks at 2080 and 2110 $cm^{-1}$.

EXAMPLE 5

Preparation of Copolymer 5

25 g Mowital B 60 T (polyvinyl butyral available from Clariant having portions of 26 wt.-% polyvinyl alcohol, 70 wt.-% butyracetal, and 3 wt.-% vinyl acetate units) were dissolved in 700 ml dried methyl ethyl ketone by heating at 50° C. Subsequently, 10 g maleic acid anhydride and 0.7 ml triethylamine were added and the mixture was kept for another 6 hours under stirring at this temperature. The polymer was precipitated in 500 ml of water and dried for 24 hours at 40° C. The acid number determined for this product was 53 mg KOH per gram. 15 g of this polymer were dissolved in 60 ml water and 120 ml n-propanol at 50° C. in a three-neck flask equipped with magnetic stirrer, reflux condenser and thermometer on a water bath. Then, 0.7 g concentrated hydrochloric acid were added. Subsequently, 1.5 g of 4-azido benzaldehyde were added drop-wise and the mixture was stirred for 3 hours at 50° C. The polymer compound was isolated by precipitation in 500 ml of water, filtered and dried in a vacuum oven at 40° C. for 24 hours. The analytical examination of the product showed the typical IR peaks at 2080 and 2110 $cm^{-1}$ for the azido group and an acid number of 42 mg KOH per gram polymer.

EXAMPLE 6

Preparation of a Lithographic Printing Plate by using Copolymer 2

An infrared sensitive coating formulation was prepared from the following components:

5.0 g of copolymer 2;

0.3 g of Renol blue B2G-HW® (Clariant: copper phthalocyanine pigment dispersed in polyvinyl butyral); and 0.6 g IR dye Ec 2117 (available from FEW, Wolfen, Germany).

The mentioned components were dissolved under stirring in 100 ml of a mixture consisting of:

45 parts by volume methanol;

30 parts by volume methyl glycol; and 25 parts by volume methyl ethyl ketone.

After filtering the solution, it was applied to an electrochemically grained and anodized aluminum foil that was subjected to an aftertreatment using polyvinyl phosphonic acid by means of common methods and the coating was dried for 4 minutes at 90° C. The dry weight of the printing layer amounted to approx. 1.3 $g/m^2$.

The plate was imaged on a Creo-Trendsetter 3244, which was equipped with multiple diode laser beams producing radiation with a wavelength at about 830 nm, and an energy density between 200 and 400 $mJ/cm^2$ using a UGRA/FOGRA Postscript Control Strip version 2.0 EPS. The plate was developed with Kodak Polychrome Graphics® 956 developer to produce a high resolution printing image.

The plate then was mounted on a conventional sheet-fed offset printing machine; good prints were obtained after 9 copies. The plate continued to deliver flawless prints up to 40,000 copies.

EXAMPLE 7

Preparation of a Lithographic Printing Plate by using Copolymer 4

A coating solution according to Example 6 was prepared, wherein copolymer 4 was used instead of copolymer 2. Further processing took place as described in Example 6. In the sheet-fed offset printing machine, one lithographic plate provided 35,000 copies of good quality.

EXAMPLE 8

Example 6 was repeated, however, copolymer 5 was used instead of copolymer 2. The resulted image exhibited well resolved 2% highlight dots and 98% shadows.

Although this invention has been illustrated by reference to specific embodiments, it will be apparent to those skilled in the art that various changes and modifications may be made which clearly fall within the scope of this invention.

We claim:

1. A radiation-sensitive composition, comprising:

(i) a copolymer comprising the units A, B, C and D, wherein A is present in an amount of 0.5 to 30 wt. % and is of the formula (A)

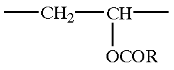

wherein R is hydrogen, $C_1$–$C_4$ alkyl, —CH═CH—COQH or

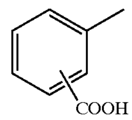

B is present in an amount of 5 to 35 wt. % and is of the formula (B)

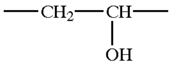

C is present in an amount of 10 to 55 wt. % and is of the formula (C)

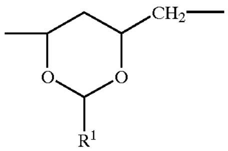

wherein $R^1$ is an alkyl group with up to 4 carbons, which is optionally substituted by an acid group, or a phenyl group to which an acid group is attached, wherein the phenyl group optionally comprises 1 to 2 further substituents selected from halogen atoms, amino, methoxy, ethoxy, methyl and ethyl groups, or is a group Z—$NR^2$—CO—Y—COOH, wherein Z is an aliphatic, aromatic or araliphatic spacer group, $R^2$, is hydrogen or an aliphatic, aromatic oraraliphatic moiety and Y is a saturated or unsaturated chain- or ring-shaped spacer group, and unit C may have one or more occurrences in the copolymer with various moieties $R^1$ independent of one another, and D is present in an amount of 10 to 40 wt. % and is of the formula (D)

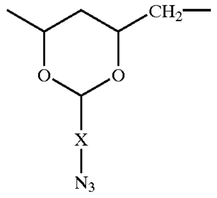

wherein X is $C_1$–$C_6$ alkylene, a 5 or 6 membered saturated carbocyclic moiety optionally substituted with one or more substituents selected from the group consisting of $C_1$–$C_4$ alkyl, $C_1$–$C_4$ alkoxy and halogen, a 5 or 6 membered saturated heterocyclic moiety which comprises in the nucleus one or more heteroatoms selected from oxygen, nitrogen and sulfur, or a group of the formula I (I)

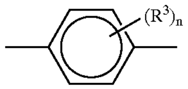

wherein n is an integer from 0 to 4 and each $R^3$ is independently selected from the group consisting of $C_1$–$C_4$ alkyl, halogen and $C_1$–$C_4$ alkoxy; and (ii) a compound selected to have a maximum energy absorption wavelength in the range of about 750 to about 1120 nm and to convert absorbed energy to heat.

2. The composition according to claim 1, wherein R is methyl.

3. The composition according to claim 1, wherein X is 1,4-phenylene.

4. The composition of claim 1, wherein each $R^1$ is an ethyl group.

5. The composition of claim 1, wherein unit D is present in an amount of at least 20 wt. % of the copolymer acetal.

6. The composition of claim 1, wherein the weight-average molecular weight $M_w$ of the copolymer is from about 40,000 to about 230,000 g/mole.

7. The composition according to claim 1, additionally comprising at least one other component selected from the group consisting of (a) dyes, pigments and combinations thereof for increasing the color of the image, (b) surfactants, (c) exposure indicators and (d) plasticizers.

8. A method of producing a radiation-sensitive element comprising coating a support with a radiation-sensitive composition comprising:

(i) a copolymer comprising the units A, B, C and D, wherein A is present in an amount of 0.5 to 30 wt. % and is of the formula (A)

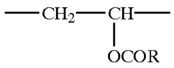

wherein R is hydrogen, $C_1$–$C_4$ alkyl, —CH═CH—COOH or

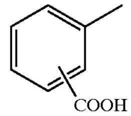

B is present in an amount of 5 to 35 wt. % and is of the formula (B)

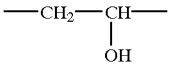

C is present n an amount of 10 to 55 wt. % and is of the formula (C)

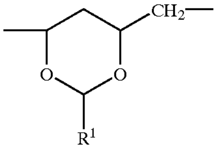

wherein $R^1$ is an alkyl group with up to 4 carbons, which is optionally substituted by an acid group, or a phenyl group to which an acid group is attached, wherein the phenyl group optionally comprises 1 to 2 further substituents selected from halogen atoms, amino, methoxy, ethoxy, methyl and ethyl groups, or is a group Z—$NR^2$-CO—Y—COOH, wherein Z is an aliphatic, aromatic or araliphatic spacer group, $R^2$ is hydrogen or an aliphatic, aromatic or araliphatic moiety and Y is a saturated or unsaturated chain- or ring-shaped spacer group, and unit C may have one or more occurrences in the copolymer with various moieties $R^1$ independent of one another, and D is present in an amount of 10 to 40 wt. % and is of the formula (D)

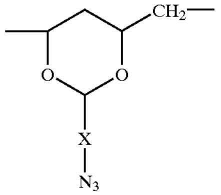

wherein X is $C_1$–$C_6$ alkylene, a 5 or 6 membered saturated carbocyclic moiety optionally substituted with one or more substituents selected from the group consisting of $C_1$–$C_4$ alkyl, $C_1$–$C_4$ alkoxy and halogen, a 5 or 6 membered saturated heterocyclic moiety which comprises in the nucleus one or more heteroatoms selected from oxygen, nitrogen and sulfur, or a group of the formula I (I)

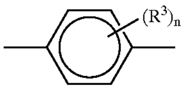

wherein n is an integer from 0 to 4 and each $R^3$ is independently selected from the group consisting of $C_1$–$C_4$ alkyl, halogen and $C_1$–$C_4$ alkoxy; and (ii) a compound selected to have a maximum energy absorption wavelength in the range of about 750 to about 1120 nm and to convert absorbed energy to heat.

9. The method of claim 8, wherein the support is an optionally pretreated aluminum substrate.

10. A lithographic printing plate precursor obtainable by coating a support with a radiation-sensitive composition comprising:

(i) a copolymer comprising the units A, B, C and D, wherein A is present in an amount of 0.5 to 30 wt. % and is of the formula (A)

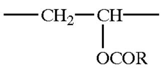

wherein R is hydrogen, $C_1$–$C_4$ alkyl, —CW═CH—COOH or

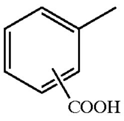

B is present in an amount of 5 to 35 wt. % and is of the formula (B)

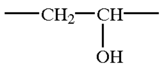

C is present in an amount of 10 to 55 wt. % and is of the formula (C)

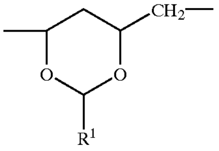

wherein $R^1$ is an alkyl group with up to 4 carbons, which is optionally substituted by an acid group, or a phenyl group to which an acid group is attached, wherein the phenyl group optionally comprises 1 to 2 further substituents selected from halogen atoms, amino, methoxy, ethoxy, methyl and ethyl groups, or is a group Z—$NR^2$—CO—Y—COOH, wherein Z is an aliphatic, aromatic or araliphatic spacer group, $R^2$ is hydrogen or an aliphatic, aromatic or araliphatic moiety and Y is a saturated or unsaturated chain- or ring-shaped spacer group, and unit C may have one or more occurrences in the copolymer with various moieties $R^1$ independent of one another, and D is present in an amount of 10 to 40 wt. % and is of the formula (D)

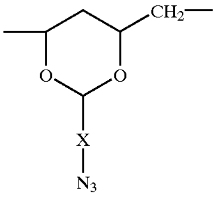

wherein X is $C_1$–$C_6$ alkylene, a 5 or 6 membered saturated carbocyclic moiety optionally substituted with one or more substituents selected from the group consisting of $C_1$–$C_4$ alkyl, $C_1$–$C_4$ alkoxy and halogen, a 5 or 6 membered saturated heterocyclic moiety which comprises in the nucleus one or more heteroatoms selected from oxygen, nitrogen and sulfur, or a group of the formula I (I)

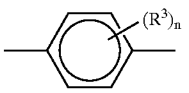

wherein n is an integer from 0 to 4 and each $R^3$ is independently selected from the group consisting of $C_1$–$C_4$ alkyl, halogen and $C_1$–$C_4$ alkoxy; and (ii) a compound selected to have a maximum energy absorption wavelength in the range of about 750 to about 1120 nm and to convert absorbed energy to heat.

* * * * *

UNITED STATES PATENT AND TRADEMARK OFFICE

CERTIFICATE OF CORRECTION

PATENT NO. : 6,596,460 B2
DATED : July 22, 2003
INVENTOR(S) : Hans-Joachim Timpe et al.

It is certified that error appears in the above-identified patent and that said Letters Patent is hereby corrected as shown below:

Column 12,
Line 67, delete "COQH" and insert therefor -- COOH --

Column 13,
Line 35, delete "oraraliphatic" and insert therefore -- or araliphatic --

Signed and Sealed this

Twenty-eighth Day of October, 2003

JAMES E. ROGAN
*Director of the United States Patent and Trademark Office*